(12) United States Patent
Matsumoto et al.

(10) Patent No.: US 6,879,043 B2
(45) Date of Patent: Apr. 12, 2005

(54) ELECTRODE STRUCTURE AND METHOD FOR FABRICATING THE SAME

(75) Inventors: Michikazu Matsumoto, Uji (JP); Naohisa Sengoku, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/922,804

(22) Filed: Aug. 7, 2001

(65) Prior Publication Data

US 2002/0050644 A1 May 2, 2002

(30) Foreign Application Priority Data

Oct. 30, 2000 (JP) ......................................... 2000-329972

(51) Int. Cl.[7] .............................................. H01L 23/48
(52) U.S. Cl. ...................... 257/751; 257/760; 257/764; 257/770; 257/753; 257/752; 438/627; 438/647; 438/628; 438/644
(58) Field of Search .............................. 257/751, 915, 257/753, 407, 388, 301, 306; 438/393, 396, 381, 399, 253, 612, 642, 657, 47, 52, 60

(56) References Cited

U.S. PATENT DOCUMENTS

| | | | | |
|---|---|---|---|---|
| 5,561,326 A | * | 10/1996 | Ito et al. ....................... 257/751 |
| 5,747,361 A | * | 5/1998 | Ouellet ......................... 437/190 |
| 5,759,916 A | * | 6/1998 | Hsu et al. ..................... 438/636 |
| 5,973,408 A | * | 10/1999 | Nagasaka et al. ............ 257/915 |
| 6,215,186 B1 | * | 4/2001 | Konecni et al. ............. 257/751 |
| 6,218,256 B1 | * | 4/2001 | Agarwal ....................... 438/393 |
| 6,271,573 B1 | * | 8/2001 | Suguro ......................... 257/407 |
| 6,346,467 B1 | * | 2/2002 | Chang et al. ................ 438/594 |
| 6,368,900 B1 | * | 4/2002 | Kenkaraseril ............... 438/131 |
| 6,413,858 B1 | * | 7/2002 | Chopra ......................... 438/643 |
| 6,465,828 B1 | * | 10/2002 | Agarwal ...................... 257/296 |

FOREIGN PATENT DOCUMENTS

| | | |
|---|---|---|
| JP | 60-153121 | 8/1985 |
| JP | 63-259075 | 10/1988 |
| JP | 63-272049 | 11/1988 |
| JP | 05-152250 | 6/1993 |
| JP | 07-094449 | 4/1995 |
| JP | 07-094731 | 4/1995 |
| JP | 08-186086 | 7/1996 |
| JP | 10-012869 | 1/1998 |
| JP | 11-068095 | 3/1999 |
| JP | 11-163325 | 6/1999 |
| JP | 11-261059 | 9/1999 |

OTHER PUBLICATIONS

Takuo Sugano, "Super-speed MOS Device", pp. 155, line 14–21, Published Dec. 15, 1986, Partial English Translation.

* cited by examiner

Primary Examiner—Nathan J. Flynn
Assistant Examiner—Fazli Erdem
(74) Attorney, Agent, or Firm—Nixon Peabody LLP (57) ABSTRACT

The electrode structure of this invention includes a silicon-containing film containing silicon as a principal constituent; a barrier metal layer of titanium nitride rich in titanium as compared with a stoichiometric ratio formed on the silicon-containing film; and a metal film with a high melting point formed on the barrier metal layer.

10 Claims, 10 Drawing Sheets

ELECTRODE STRUCTURE AND METHOD FOR FABRICATING THE SAME

BACKGROUND OF THE INVENTION

The present invention relates to an electrode structure including a silicon-containing film containing silicon as a principal constituent, a barrier metal layer formed on the silicon-containing film and a metal film with a high melting point formed on the barrier metal layer, and a method for fabricating the electrode structure.

In a conventional MOS transistor, the gate electrode is formed from a polysilicon film. In accordance with increased refinement and operation speed of LSIs, there are increasing demands for lowering the resistance of a gate electrode of a MOS transistor.

For the purpose of lowering the resistance of a gate electrode, technique to use, as a gate electrode, a polymetal gate electrode of a multi-layer film including a lower polysilicon film and an upper metal film with a high melting point is proposed, and a tungsten film is proposed for use as the upper metal film with a high melting point. When a tungsten film is used as the upper metal film with a high melting point, the resistance of the gate electrode can be lowered.

It is necessary to form, between the polysilicon film and the tungsten film, a barrier metal layer of, for example, titanium nitride (TiN) for preventing a dopant (such as B, P and As) introduced into the polysilicon film from diffusing into the tungsten film (as described in, for example, Japanese Laid-Open Patent Publication No. 11-261059).

Figure 8:
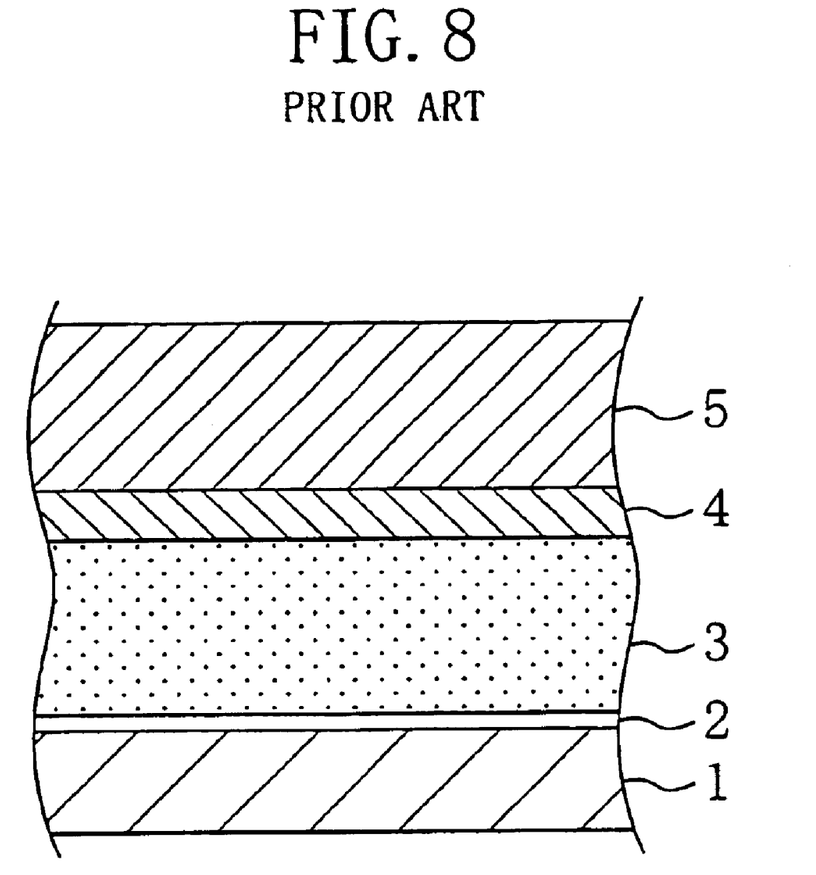
FIG. 8 is a cross-sectional view of a conventional electrode structure.

FIG. 8 shows the cross-sectional structure of a multi-layer film obtained before forming a polymetal gate electrode by patterning. As shown in FIG. 8, a polysilicon film 3, a barrier metal layer 4 of a titanium nitride film and a tungsten film 5 are successively formed on a semiconductor substrate 1 with a gate insulating film 2 sandwiched therebetween. The polymetal gate electrode is formed by patterning the multi-layer film.

In the conventional polymetal gate electrode, the interface resistance between the polysilicon film 3 and the barrier metal layer 4 is disadvantageously high. Also, when the polymetal gate electrode is subjected to high temperature annealing, such as annealing for activating dopant layers serving as the source and the drain, the interface resistance becomes higher.

The present inventors have variously studied the cause of the high interface resistance between the polysilicon film 3 and the barrier metal layer 4, resulting in finding the following. Now, the reasons why the interface resistance between the polysilicon film 3 and the barrier metal layer 4 is high and why the interface resistance becomes higher through high temperature annealing will be described with reference to FIGS. 9A and 9B.

Figure 9A:
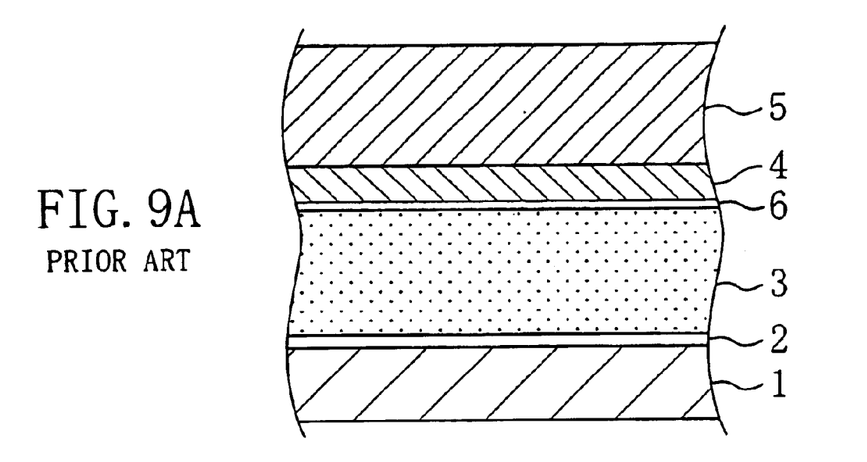
FIGS. 9A and 9B are cross-sectional views for explaining problems of the conventional electrode structure.

FIG. 9A shows the cross-sectional structure, observed with a TEM (transmission type electron microscope), of a multi-layer film, which is to be patterned into a polymetal gate electrode, formed by successively depositing a barrier metal layer 4 of titanium nitride and a tungsten film 5 on a polysilicon film 3. On the interface between the polysilicon film 3 and the barrier metal layer 4, a reaction layer 6 of a compound (SiN) principally including silicon (Si) and nitrogen (N) having a very high resistance value is formed. Owing to the reaction layer 6, the interface resistance between the polysilicon film 3 and the barrier metal layer 4 is high.

Figure 9B:
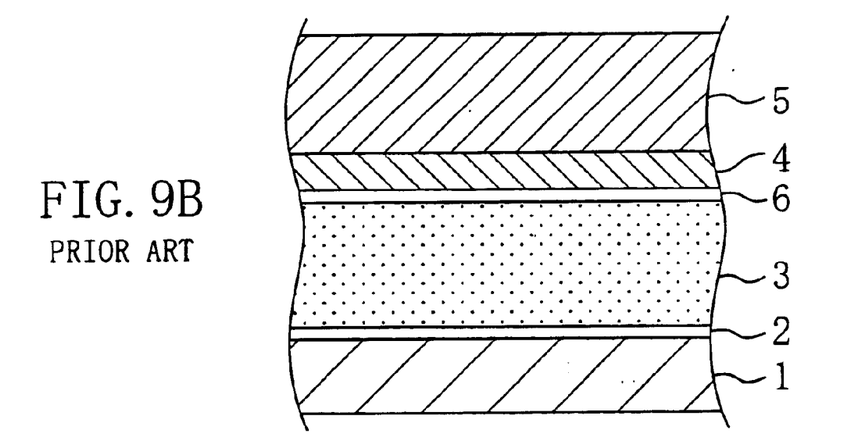

FIG. 9B shows the cross-sectional structure, observed with a TEM, of the multi-layer film to be patterned into a polymetal gate electrode obtained after subjecting it to high temperature annealing. As is understood from comparison between FIGS. 9A and 9B, the reaction layer 6 is increased in its thickness because the reaction between silicon and nitrogen is proceeded through the high temperature annealing. Accordingly, the interface resistance between the polysilicon film 3 and the barrier metal layer 4 becomes higher.

Now, the procedures for successively depositing a barrier metal layer 4 of titanium nitride and a tungsten film 5 on a polysilicon film 3 will be described with reference to FIGS. 10A through 10C.

Figure 10A:
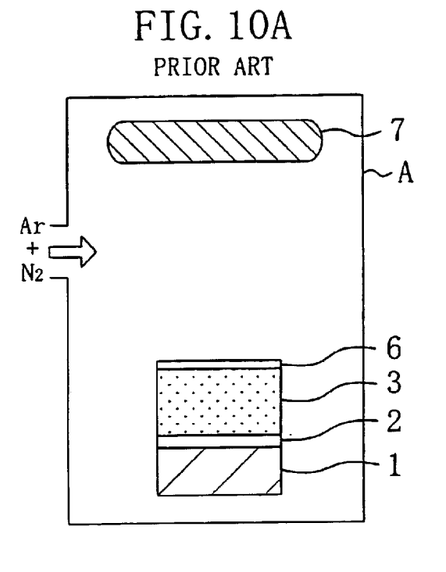
FIGS. 10A, 10B and 10C are cross-sectional views for showing procedures in a method for fabricating the conventional electrode structure.

First, as shown in FIG. 10A, a polysilicon film 3 is deposited on a semiconductor substrate 1 with a gate insulating film 2 sandwiched therebetween, and the resultant semiconductor substrate 1 is placed in a first chamber A in which a titanium target 7 including titanium as a principal constituent is disposed. Thereafter, a mixed gas of an argon gas and a nitrogen gas (in which the partial pressure ratio (volume flow ratio) of the nitrogen gas is approximately 60%) is introduced into the first chamber A, and discharge is caused in the first chamber A. Thus, plasma of the argon gas and the nitrogen gas is generated, so that a reaction layer 6 of a compound including silicon and nitrogen as principal constituents can be formed on the polysilicon film 3 through a reaction between nitrogen ions included in the plasma and silicon included in the polysilicon film 3.

Figure 10B:
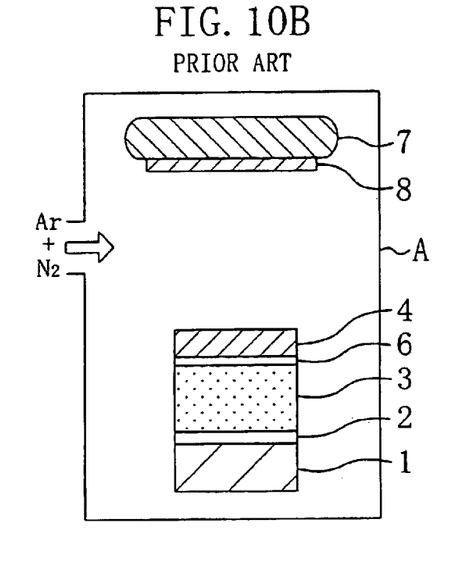
Figure 10C:
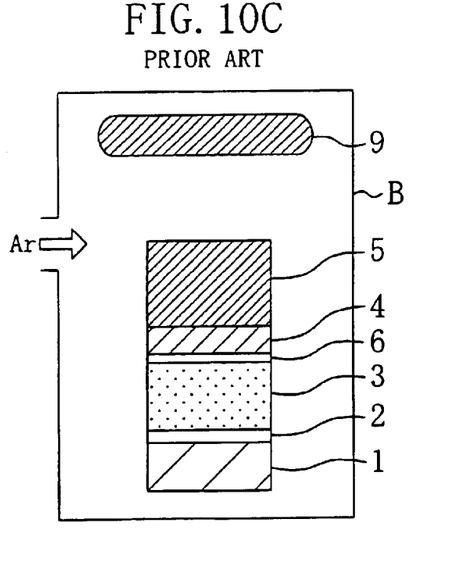

When the discharge is continuously caused in the first chamber A, a titanium nitride film 8 is formed on the titanium target 7 and the titanium nitride film 8 is sputtered so as to form a barrier metal layer 4 of titanium nitride on the reaction layer 6 as shown in FIG. 10B.

Next, after the resultant semiconductor substrate 1 is placed in a second chamber B in which a tungsten target 9 including tungsten as a principal constituent is disposed, an argon gas is introduced into the second chamber B and discharge is caused in the second chamber B. Thus, the tungsten target 9 is sputtered so as to deposit a tungsten film 5 on the barrier metal layer 4.

Subsequently, dopant layers serving as the source and the drain of the MOS transistor are formed in the semiconductor substrate 1, and annealing is carried out at a temperature of 750 or more for activating the dopant layers. Thus, excessive nitrogen included in the barrier metal layer 4 of titanium nitride and silicon included in the polysilicon film 3 are reacted with each other, resulting in increasing the thickness of the reaction layer 6 as shown in FIG. 9B.

When the interface resistance between the polysilicon film 3 and the barrier metal layer 4 is high and therefore the interface resistance between the polysilicon film 3 and the tungsten film 5 is high, the operation speed of the MOS transistor is lowered. Specifically, when the gate electrode is operated with AC (alternating current), distributed capacitance generated in the gate insulating film is repeatedly charged and discharged. Therefore, a current flows through the distributed interface resistance, and hence, the distributed interface resistance affects to lower the operation speed of the MOS transistor. When the operation speed of the MOS transistor is lowered, the operation speed of the entire LSI is lowered, so as to disadvantageously increase signal delay time. Since the operation speed of an LSI is regarded to be the most significant today, the lowering of the operation speed of the MOS transistor by merely several % becomes a serious problem.

In order to prevent the delay time of the MOS transistor from lowering, the interface resistance between the polysilicon film and the metal film with a high melting point should be 200 Ùm² or less.

SUMMARY OF THE INVENTION

In consideration of the aforementioned conventional problems, an object of the invention is lowering interface resistance between a silicon-containing film and a metal film with a high melting point included in an electrode structure.

In order to achieve the object, the first electrode structure of this invention comprises a silicon-containing film containing silicon as a principal constituent; a barrier metal layer of titanium nitride rich in titanium as compared with a stoichiometric ratio formed on the silicon-containing film; and a metal film with a high melting point formed on the barrier metal layer.

In the first electrode structure, the barrier metal layer of the titanium nitride rich in titanium as compared with the stoichiometric ratio is formed between the silicon-containing film and the metal film with a high melting point, and therefore, the amount of nitrogen included in the barrier metal layer is small. Accordingly, since the barrier metal layer includes a small amount of nitrogen to be reacted with silicon of the silicon-containing film through high temperature annealing of the first electrode structure, a reaction layer of a compound principally including silicon and nitrogen is never formed or is formed in merely a small thickness between the barrier metal layer and the silicon-containing film. As a result, even when the first electrode structure is subjected to high temperature annealing, the interface resistance between the silicon-containing film and the barrier meta layer can be prevented from increasing and therefore the interface resistance between the silicon-containing film and the metal film with a high melting point can be prevented from increasing.

The second electrode structure of this invention comprises a silicon-containing film containing silicon as a principal constituent; a first barrier metal layer of titanium nitride rich in titanium as compared with a stoichiometric ratio formed on the silicon-containing film; a second barrier metal film of titanium nitride including nitrogen in a ratio not less than a stoichiometric ratio formed on the first barrier metal layer; and a metal film with a high melting point formed on the second barrier metal layer.

In the second electrode structure, since the first barrier metal layer of the titanium nitride rich in titanium as compared with the stoichiometric ratio is formed on the silicon-containing film, the amount of nitrogen reacted with silicon of the silicon-containing film through high temperature annealing of the second electrode structure is small. Therefore, a reaction layer of a compound principally including silicon and nitrogen is never formed or is formed in merely a small thickness between the first barrier metal layer and the silicon-containing film. Accordingly, even when the second electrode structure is subjected to high temperature annealing, the interface resistance between the silicon-containing film and the first barrier metal layer can be prevented from increasing and therefore the interface resistance between the silicon-containing film and the metal film with a high melting point can be prevented from increasing.

Furthermore, since the first barrier metal layer and the second barrier metal layer are disposed between the silicon-containing film and the metal film with a high melting point, a dopant introduced into the silicon-containing film is prevented from moving by the first barrier metal layer and the second barrier metal layer and hence is prevented from diffusing into the metal film with a high melting point. Also, a silicide layer of the metal with a high melting point can be avoided from being formed through a reaction between silicon of the silicon-containing film and the metal with a high melting point of the metal film.

Accordingly, even when the first or second electrode structure is subjected to high temperature annealing carried out at a temperature exceeding 600, the interface resistance value between the silicon-containing film and the metal film with a high melting point can be suppressed to 200 Ù1m² or less, resulting in preventing the operation speed of the MOS transistor from lowering.

The first method for fabricating an electrode structure of this invention comprises the steps of forming a silicon-containing film containing silicon as a principal constituent; forming, on the silicon-containing film, a barrier metal layer of titanium nitride rich in titanium as compared with a stoichiometric ratio; forming a metal film with a high melting point on the barrier metal layer, whereby forming a multi-layer film including the silicon-containing film, the barrier metal layer and the metal film with a high melting point; and patterning the multi-layer film into an electrode structure.

In the first method for fabricating an electrode structure, after forming the barrier metal layer of the titanium nitride rich in titanium as compared with the stoichiometric ratio on the silicon-containing film, the metal film with a high melting point is formed on the barrier metal layer. Therefore, the first electrode structure in which the interface resistance between the silicon-containing film and the metal film with a high melting point can be prevented from increasing even through high temperature annealing can be fabricated.

In the first method for fabricating an electrode structure, the step of forming the barrier metal layer preferably includes a sub-step of using a target of titanium nitride rich in titanium as compared with a stoichiometric ratio and causing discharge in an inert gas including substantially no nitrogen, whereby depositing, on the silicon-containing film, the titanium nitride rich in titanium as compared with the stoichiometric ratio sputtered out from the target.

Since the target of the titanium nitride rich in titanium as compared with the stoichiometric ratio is used and the discharge is caused in the inert gas including substantially no nitrogen in this manner, the titanium nitride rich in titanium as compared with the stoichiometric ratio can be definitely deposited on the silicon-containing film.

In the first method for fabricating an electrode structure, the step of forming the barrier metal layer preferably includes a sub-step of using a target of titanium including substantially no nitrogen and causing discharge in a mixed gas of a nitrogen gas and an inert gas with a partial pressure ratio of the nitrogen gas lower than a nitriding point of the target, whereby depositing, on the silicon-containing film, titanium nitride rich in titanium as compared with a stoichiometric ratio formed through a reaction between titanium sputtered out from the target and nitrogen ions included in the mixed gas.

Since the target of titanium including substantially no nitrogen is used and the discharge is caused in the mixed gas of the nitrogen gas and the inert gas with the partial pressure ratio of the nitrogen gas lower than the nitriding point of the target in this manner, the titanium nitride rich in titanium as compared with the stoichiometric ratio can be definitely deposited on the silicon-containing film.

The second method for fabricating an electrode structure of this invention comprises the steps of forming a silicon-containing film containing silicon as a principal constituent; forming, on the silicon-containing film, a first barrier metal layer of titanium nitride rich in titanium as compared with a stoichiometric ratio; forming, on the first barrier metal layer, a second barrier metal layer of titanium nitride including nitrogen in a ratio not less than a stoichiometric ratio; forming a metal film with a high melting point on the second barrier metal layer, whereby forming a multi-layer film including the silicon-containing film, the first barrier metal layer, the second barrier metal layer and the metal film with a high melting point; and patterning the multi-layer film into an electrode structure.

In the second method for fabricating an electrode structure, after successively forming, on the silicon-containing film, the first barrier metal layer of the titanium nitride rich in titanium as compared with the stoichiometric ratio and the second barrier metal layer of the titanium nitride including nitrogen in a ratio not less than the stoichiometric ratio, the metal film with a high melting point is formed on the second barrier metal layer. Therefore, the second electrode structure in which the interface resistance between the silicon-containing film and the metal film with a high melting point can be prevented from increasing even through high temperature annealing can be fabricated.

In the second method for fabricating an electrode structure, the step of forming the first barrier metal layer preferably includes a sub-step of using a target of titanium nitride rich in titanium as compared with a stoichiometric ratio and causing discharge in an inert gas including substantially no nitrogen, whereby depositing, on the silicon-containing film, the titanium nitride rich in titanium as compared with the stoichiometric ratio sputtered out from the target, and the step of forming the second barrier metal layer preferably includes a sub-step of using the target and causing discharge in a mixed gas of a nitrogen gas and an inert gas with a partial pressure ratio of the nitrogen gas not less than a nitriding point of the target, whereby forming, on the target, a titanium nitride film rich in titanium as compared with the stoichiometric ratio and depositing, on the first barrier metal layer, the titanium nitride rich in titanium as compared with the stoichiometric ratio sputtered out from the titanium nitride film formed on the target.

Since the first barrier metal layer is thus formed by using the target of the titanium nitride rich in titanium as compared with the stoichiometric ratio and causing discharge in the inert gas including substantially no nitrogen in this manner, the first barrier metal layer of the titanium nitride rich in titanium as compared with the stoichiometric ratio can be definitely deposited on the silicon-containing film. Also, since the second barrier metal layer is formed by causing discharge in the mixed gas of the nitrogen gas and the inert gas with the partial pressure ratio of the nitrogen gas not less than the nitriding point of the target, the second barrier metal layer of the titanium nitride including nitrogen in a ratio not less than the stoichiometric ratio can be definitely deposited on the-first barrier metal layer.

In the second method for fabricating an electrode structure, the step of forming the first barrier metal layer preferably includes a sub-step of using a target including substantially no nitrogen and causing discharge in a mixed gas of a nitrogen gas and an inert gas with a partial pressure ratio of the nitrogen gas lower than a nitriding point of the target, whereby depositing, on the silicon-containing film, titanium nitride rich in titanium as compared with a stoichiometric ratio formed through a reaction between titanium sputtered out from the target and nitrogen ions included in the mixed gas, and the step of forming the second barrier metal layer preferably includes a sub-step of using the target and causing discharge in a mixed gas of a nitrogen gas and an inert gas with a partial pressure ratio of the nitrogen gas not less than the nitriding point of the target, whereby forming, on the target, a titanium nitride film rich in titanium as compared with a stoichiometric ratio and depositing, on the first barrier metal layer, the titanium nitride rich in titanium as compared with the stoichiometric ratio sputtered out from the titanium nitride film formed on the target.

Since the first barrier metal layer is formed by using the target of titanium including substantially no nitrogen and causing discharge in the mixed gas of the nitrogen gas and the inert gas with the partial pressure ratio of the nitrogen gas lower than the nitriding point of the target in this manner, the first barrier metal layer of the titanium nitride rich in titanium as compared with the stoichiometric ratio can be definitely deposited on the silicon-containing film. Also, the second barrier metal layer is formed by causing discharge in the mixed gas of the nitrogen gas and the inert gas with the partial pressure ratio of the nitrogen gas not less than the nitriding point of the target, the second barrier metal layer of the titanium nitride including nitrogen in a ratio not less than the stoichiometric ratio can be definitely deposited on the first barrier metal layer.

In the first or second method for fabricating an electrode structure, no titanium silicide layer is preferably formed on the silicon-containing film through annealing carried out on the electrode structure at a temperature of 600 or more.

Thus, occurrence of peeling between the silicon-containing film and the metal film with a high melting point can be definitely prevented.

Accordingly, even when the electrode structure fabricated by the first or second method for fabricating an electrode structure is subjected to high temperature annealing carried out at a temperature of 600 or more, the interface resistance between the silicon-containing film and the metal film with a high melting point can be suppressed to 200 Ù1m$^2$ or less, resulting in preventing the operation speed of the MOS transistor from lowering.

DETAILED DESCRIPTION OF THE INVENTION

Embodiment 1

The structure of a polymetal gate electrode according to Embodiment 1 of the invention will now be described with reference to FIG. 1A.

Figure 1A:
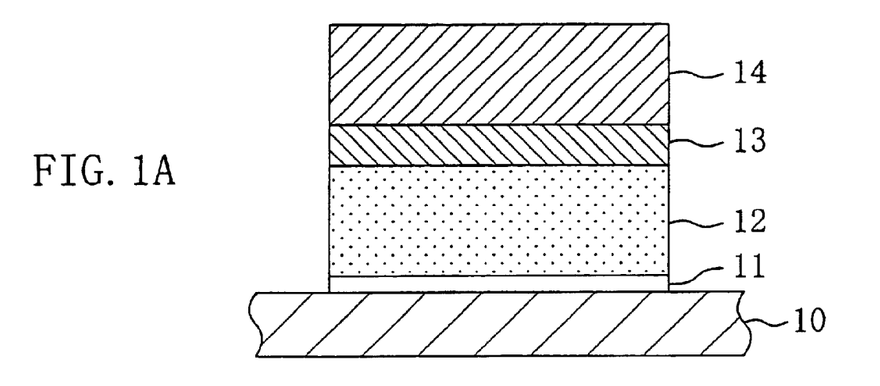
FIG. 1A is a cross-sectional view of an electrode structure according to Embodiment 1 of the invention and FIG. 1B is a cross-sectional view of an electrode structure according to Embodiment 2 of the invention.

As shown in FIG. 1A, on a semiconductor substrate 10 in which dopant diffusion layers (not shown) serving as the source and the drain are formed, a polysilicon film 12, a barrier metal layer 13 of titanium nitride ($TiN_x$) rich in titanium as compared with a stoichiometric ratio and a tungsten film 14 are successively deposited with a gate insulating film 11 of a silicon oxide film sandwiched therebetween. A multi-layer film of the polysilicon film 12, the barrier metal layer 13 and the tungsten film 14 is patterned into the polymetal gate electrode.

In Embodiment 1, since the barrier metal layer 13 of the titanium nitride rich in titanium as compared with the stoichiometric ratio is formed between the polysilicon film 12 and the tungsten film 14, the amount of nitrogen included in the barrier metal layer 13 is small. Therefore, the barrier metal layer 13 includes merely a small amount of nitrogen to be reacted with silicon included in the polysilicon film 12 through high temperature annealing carried out on the polymetal gate electrode. Accordingly, between the barrier metal layer 13 and the polysilicon film 12, a reaction layer of a compound principally including silicon and nitrogen is never formed or is formed in merely a small thickness. As a result, the interface resistance between the barrier metal layer 13 and the polysilicon film 12 can be prevented from increasing even when the polymetal gate electrode of Embodiment 1 is subjected to high temperature annealing.

In the barrier metal layer 13 of the titanium nitride rich in titanium as compared with the stoichiometric ratio, the composition ratio x of nitrogen in the titanium nitride ($TiN_x$) is preferably, for example, 0.1≦x≦0.95 for the following reason: When x is larger than 0.95, a reaction layer 6 of a compound principally including silicon and nitrogen is formed between the polysilicon film 12 and the barrier metal layer 13 through high temperature annealing carried out on the polymetal gate electrode, resulting in increasing the interface resistance between the polysilicon film 12 and the barrier metal layer 13. Also, when x is smaller than 0.1, the content of nitrogen in the barrier metal layer 13 is so small that titanium silicide ($TiSi_2$) is formed through a reaction between silicon of the polysilicon film 12 and titanium of the barrier metal layer 13 through high temperature annealing of the polymetal gate electrode. Thereafter, when the polymetal gate electrode is subjected to high temperature annealing, titanium silicide is agglomerated so as to cause peeling.

Embodiment 2

The structure of a polymetal gate electrode according to Embodiment 2 of the invention will now be described with reference to FIG. 1B.

Figure 1B:
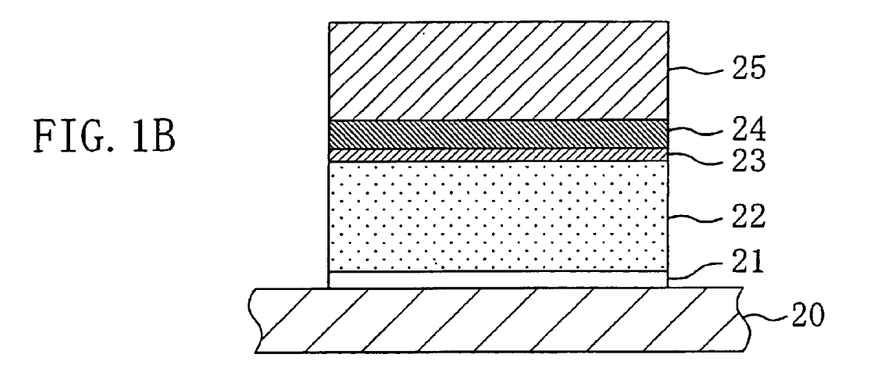

As shown in FIG. 1B, on a semiconductor substrate in which dopant diffusion layers (not shown) serving as the source and the drain are formed, a polysilicon film 22, a first barrier metal layer 23 of titanium nitride rich in titanium as compared with a stoichiometric ratio, a second barrier metal layer 24 of titanium nitride including nitrogen in a ratio not less than a stoichiometric ratio and a tungsten film 25 are successively deposited with a gate insulating film 21 of a silicon oxide film sandwiched therebetween. A multi-layer film of the polysilicon film 22, the first barrier metal layer 23, the second barrier metal layer 24 and the tungsten film 25 is patterned into the polymetal gate electrode.

In Embodiment 2, since the first barrier metal layer 23 of the titanium nitride rich in titanium as compared with the stoichiometric ratio is formed on the polysilicon film 22, the amount of nitrogen to be reacted with silicon of the polysilicon film 22 through high temperature annealing of the polymetal gate electrode is small as in Embodiment 1. Therefore, between the polysilicon film 22 and the first barrier metal layer 23, a reaction layer of a compound principally including silicon and nitrogen is never formed or is formed in merely a small thickness. Accordingly, even when the polymetal gate electrode of Embodiment 2 is subjected to high temperature annealing, the interface resistance between the polysilicon film 22 and the first barrier metal layer 23 can be prevented from increasing.

Also, since the second barrier metal layer 24 of the titanium nitride including nitrogen in a ratio not less than the stoichiometric ratio is disposed, in addition to the first barrier metal layer 23, between the polysilicon film 22 and the tungsten film 25, a dopant (such as B, P and As) introduced into the polysilicon film 22 is prevented from moving by the first barrier metal layer 23 and the second barrier metal layer 24, and hence is prevented from diffusing into the tungsten film 25. Furthermore, formation of a tungsten silicide layer through a reaction between silicon of the polysilicon film 22 and tungsten of the tungsten film 25 can be avoided.

Although tungsten is used as the metal with a high melting point included in the polymetal gate electrode of Embodiment 1 or 2, another metal film with a high melting point such as a molybdenum film or a silicide film of a metal with a high melting point (such as a $WSi_2$ film or a $MoSi_2$ film) can be used instead.

Embodiment 3

In Embodiment 3 of the invention, a first method for fabricating the polymetal gate electrode of Embodiment 1 will be described with reference to FIGS. 2A through 2C.

Figure 2A:
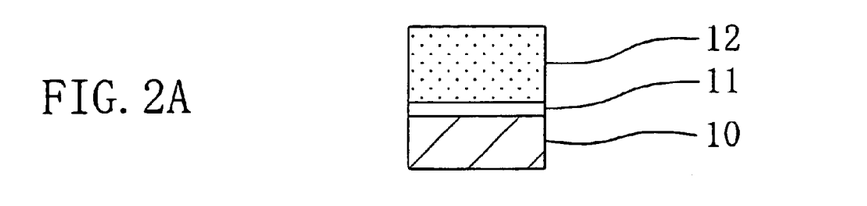
FIGS. 2A, 2B and 2C are cross-sectional views for showing procedures in a method for fabricating an electrode structure according to Embodiment 3 of the invention.

First, as shown in FIG. 2A, after a gate insulating film 11 of a silicon oxide film with a thickness of, for example, 2.6 nm is formed on a silicon substrate 10, an amorphous silicon film with a thickness of, for example, 80 nm is deposited on the gate insulating film 11 by low pressure CVD.

Next, an n-type gate electrode forming region of the amorphous silicon film is doped with phosphorus (P) ions at an implantation energy of 10 keV and a dose of $8\times10^{15}$ $cm^{-2}$, and a p-type gate electrode forming region of the amorphous silicon film is doped with boron (B) ions at an implantation energy of 5 keV and a dose of $5\times10^{15}$ $cm^{-2}$.

Then, the amorphous silicon film doped with the phosphorus ions or the boron ions is subjected to annealing at a temperature of, for example, 800 for 30 seconds. Thus, the amorphous silicon film is crystallized, thereby forming an n-type or p-type polysilicon film 12. Thereafter, a silicon oxide film formed on the polysilicon film 12 is removed by using a cleaning solution including fluoric acid.

Figure 2B:
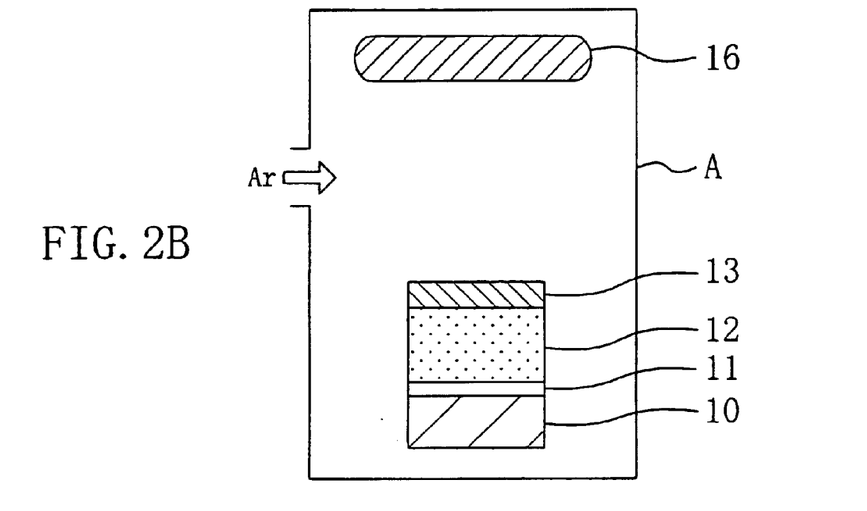

Subsequently, as shown in FIG. 2B, the resultant silicon substrate 10 is placed in a first chamber A in which a titanium nitride target 16 of titanium nitride ($TiN_x$) rich in titanium as compared with a stoichiometric ratio is disposed, an argon gas is introduced into the first chamber A and discharge is caused in the first chamber A. Thus, plasma of the argon gas is generated, so that the titanium nitride target 16 can be sputtered by argon ions included in the plasma. As a result, a barrier metal layer 13 of the titanium nitride ($TiN_x$) rich in titanium as compared with the stoichiometric ratio is formed on the polysilicon film 12.

In the titanium nitride target 16, the composition ratio x of nitrogen in the titanium nitride ($TiN_x$) rich in titanium as compared with the stoichiometric ratio is 0.1×0.95, and specifically, in the titanium nitride target 16 used in Embodiment 3, the composition ratio x of nitrogen is 0.7 in the titanium nitride ($TiN_x$). Thus, the barrier metal layer 13 of titanium nitride ($TiN_x$) in which x is 0.7 is formed on the polysilicon film 12.

Also, the barrier metal layer 13 preferably has a thickness of 5 through 30 nm, and has a thickness of approximately 10 nm in Embodiment 3.

Figure 2C:
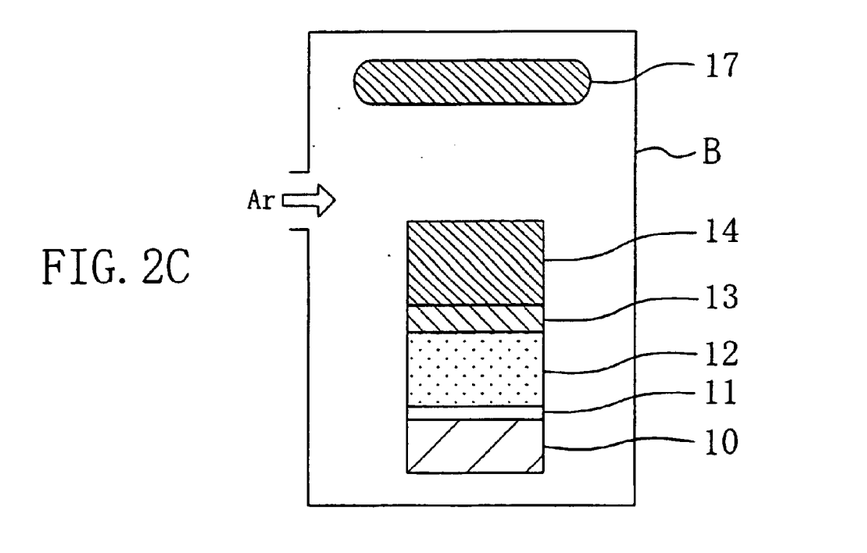

Next, as shown in FIG. 2C, the resultant silicon substrate 10 is placed in a second chamber B in which a tungsten target 17 principally including tungsten is disposed, an argon gas is introduced into the second chamber B and discharge is caused in the second chamber B. Thus, plasma of the argon gas is generated, so that the tungsten target 17 can be sputtered by argon ions included in the plasma. As a result, a tungsten film 14 with a thickness of, for example, approximately 50 nm is deposited on the barrier metal layer 13.

In Embodiment 3, the barrier metal layer 13 is deposited by the sputtering using the titanium nitride target 16 of the titanium nitride rich in titanium as compared with the stoichiometric ratio. Therefore, the barrier metal layer 13 of the titanium nitride rich in titanium as compared with the stoichiometric ratio can be definitely formed on the polysilicon film 12.

Embodiment 4

In Embodiment 4 of the invention, a second method for fabricating the polymetal gate electrode of Embodiment 1 will be described with reference to FIGS. 3A, 3B, 4A and 4B.

Figure 3A:
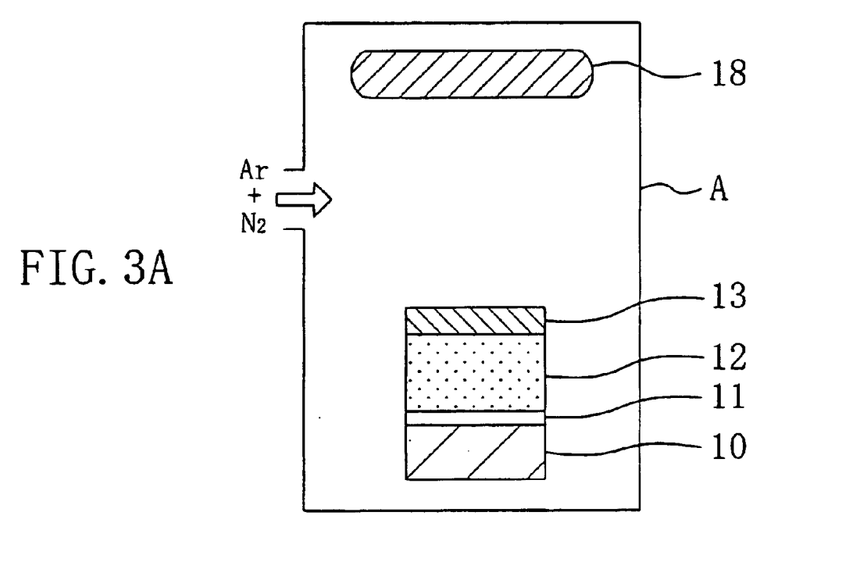
FIGS. 3A and 3B are cross-sectional views for showing procedures in a method for fabricating an electrode structure according to Embodiment 4 of the invention.

First, in the same manner as in Embodiment 3, a polysilicon film 12 with a thickness of approximately 80 nm is formed on a silicon substrate 10 with a gate insulating film 11 of a silicon oxide film sandwiched therebetween.

Next, as shown in FIG. 3A, the resultant silicon substrate 10 is placed in a first chamber A in which a titanium target 18 including substantially no nitrogen is disposed. Then, a mixed gas of an argon gas and a nitrogen gas is introduced into the first chamber A, and discharge is caused in the first chamber A under condition below a nitriding point (namely, under condition where the surface of the polysilicon film 12 is not nitrided). Thus, plasma of the argon gas is generated, so that the titanium target 18 can be sputtered by argon ions included in the plasma. Therefore, titanium sputtered out from the titanium target 18 is reacted with nitrogen ions included in the plasma, so that a barrier metal layer 13 of titanium nitride rich in titanium as compared with a stoichiometric ratio can be formed on the polysilicon film 12.

At this point, a partial pressure ratio (volume flow ratio) of the nitrogen gas included in the mixed gas introduced into the first chamber A and a target voltage applied in the discharge will be described.

Figure 4A:
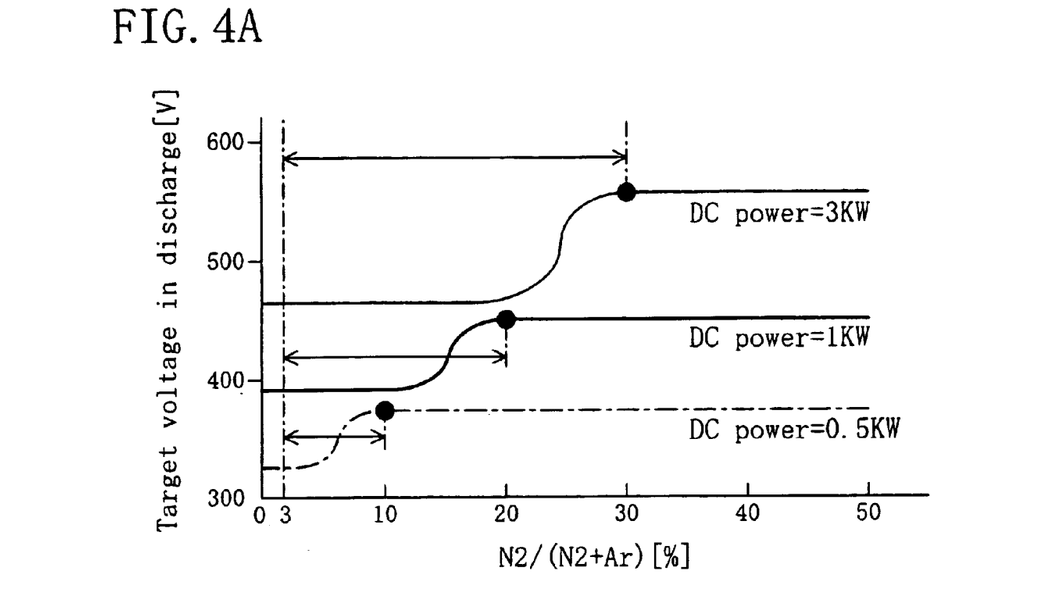
FIG. 4A is a diagram for showing the relationship between a partial pressure ratio of a nitrogen gas and a target voltage applied in discharge in forming a barrier metal layer in the method for fabricating an electrode structure of Embodiment 4 and FIG. 4B is a diagram for showing the relationship between a partial pressure ratio of a nitrogen gas and a composition ratio of titanium nitride in a barrier metal layer obtained when DC power is set to 1 kW in forming the barrier metal layer in the method for fabricating an electrode structure of Embodiment 4.

FIG. 4A shows the relationship between the partial pressure ratio of the nitrogen gas ($N_2/(N_2+Ar)$) and the target voltage applied in the discharge by using DC power of the sputtering as a parameter, wherein a black circle denotes a nitriding point. When the titanium target 18 is sputtered at the partial pressure ratio of the nitrogen gas corresponding to a region on the left hand side of the nitriding point in which the partial pressure ratio of the nitrogen gas exceeds 3%, the barrier metal layer 13 of the titanium nitride rich in titanium as compared with the stoichiometric ratio can be formed on the polysilicon film 12 substantially without forming a reaction layer principally including silicon and nitrogen.

In the case where the DC power is set to 1 kw, the partial pressure ratio of the nitrogen gas of 20% corresponds to the nitriding point, and hence, the barrier metal layer 13 is deposited with the partial pressure ratio of the nitrogen gas set to 15% in Embodiment 4.

Figure 4B:
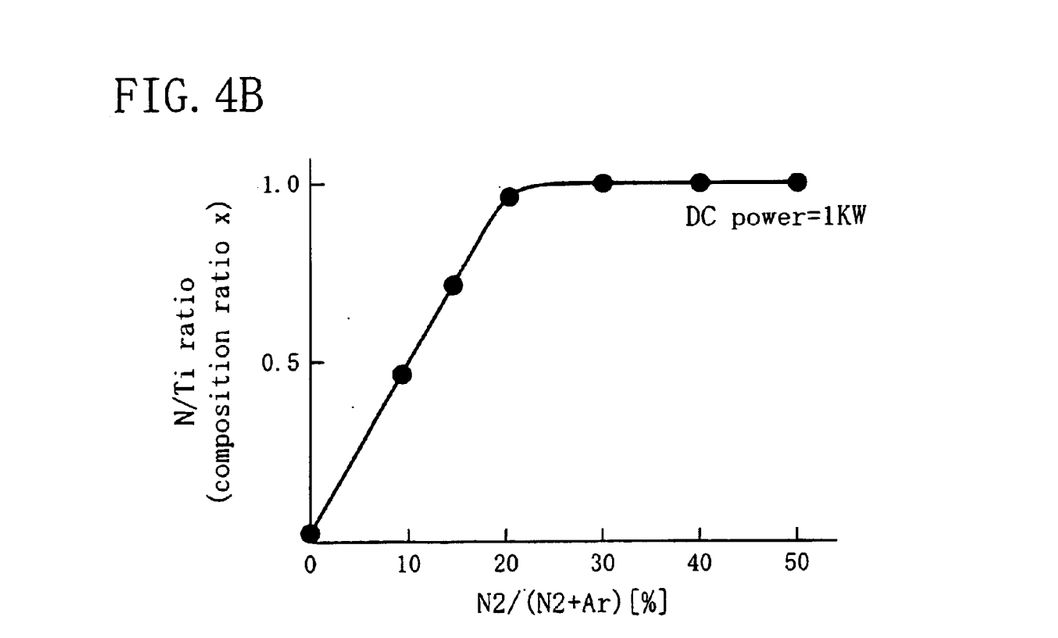

FIG. 4B shows the relationship, obtained when the DC power is set to 1 kw, between the partial pressure ratio of the nitrogen gas and the composition ratio of nitrogen in the titanium nitride (a ratio of N/Ti, namely, a value x in $TiN_x$) of the barrier metal layer 13. The composition ratio of nitrogen in the titanium nitride is obtained by XPS. As is understood from FIG. 4B, when the partial pressure ratio of the nitrogen gas is set to 15%, the composition ratio of nitrogen in the titanium nitride ($TiN_x$) of the barrier metal layer 13 can be approximately 0.7.

Similarly to Embodiment 3, the composition ratio x of nitrogen in the titanium nitride ($TiN_x$) of the barrier metal layer 13 is preferably 0.1 through 0.95, and the thickness of the barrier metal layer 13 is preferably 5 through 30 nm.

Figure 3B:
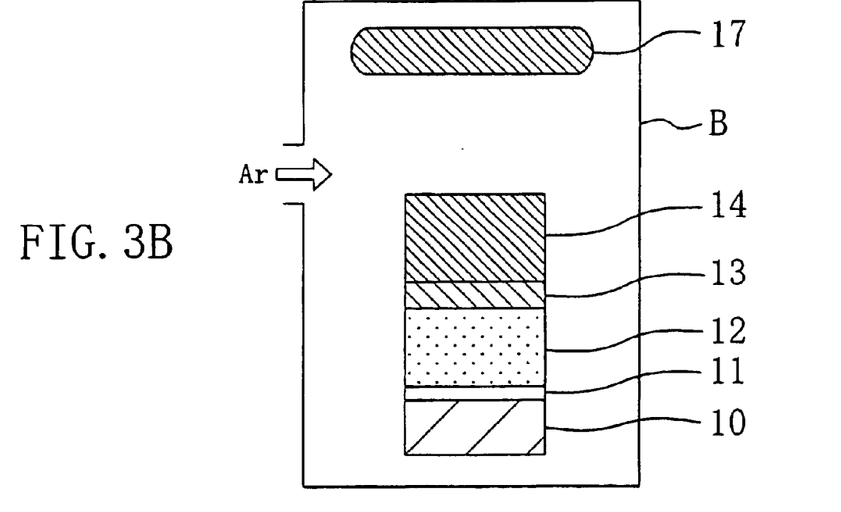

Next, as shown in FIG. 3C, the resultant silicon substrate 10 is placed in a second chamber B in which a tungsten target 17 principally including tungsten is disposed, an argon gas is introduced into the second chamber B and discharge is caused in the second chamber B. Thus, a tungsten film 14 with a thickness of, for example, approximately 50 nm is deposited on the barrier metal layer 13.

In the conventional technique, the titanium target 18 is sputtered by introducing a mixed gas with a partial pressure ratio of a nitrogen gas corresponding to a region on the right hand side of the nitriding point, namely, not less than the nitriding point, so as to form, on the polysilicon film 12, a barrier metal layer of titanium nitride with the stoichiometric ratio.

In contrast, in Embodiment 4, the titanium target 18 is sputtered by introducing the mixed gas with the partial pressure ratio of the nitrogen gas lower than the nitriding point. Accordingly, the barrier metal layer 13 of the titanium nitride rich in titanium as compared with the stoichiometric ratio can be definitely formed on the polysilicon film 12.

Embodiment 5

In Embodiment 5 of the invention, a first method for fabricating the polymetal gate electrode of Embodiment 2 will be described with reference to FIGS. 5A through 5C.

First, in the same manner as in Embodiment 3, a polysilicon film 22 with a thickness of approximately 80 nm is formed on a silicon substrate 20 with a gate insulating film 21 of a silicon oxide film sandwiched therebetween.

Figure 5A:
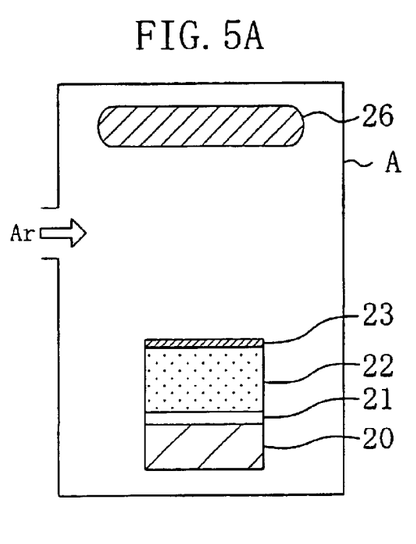
FIGS. 5A, 5B and 5C are cross-sectional views for showing procedures in a method for fabricating an electrode structure according to Embodiment 5 of the invention.

Next, as shown in FIG. 5A, the resultant silicon substrate 20 is placed in a first chamber A in which a titanium nitride target 26 of titanium nitride ($TiN_x$) rich in titanium as compared with a stoichiometric ratio is disposed, an argon gas is introduced into the first chamber A and discharge is caused in the first chamber A. Thus, in the same manner as in Embodiment 3, a first barrier metal layer 23 of the titanium nitride (TiN$_x$) rich in titanium as compared with the stoichiometric ratio is formed on the polysilicon film 22.

In the titanium nitride target 26, the composition ratio x of nitrogen in the titanium nitride (TiN$_x$) rich in titanium as compared with the stoichiometric ratio is 0.1×0.95, and specifically, in the titanium nitride target 26 used in Embodiment 5, the composition ratio x of nitrogen is 0.7 in the titanium nitride (TiN$_x$). Also, the first barrier metal layer 23 is formed in a thickness of approximately 5 nm.

Figure 5B:
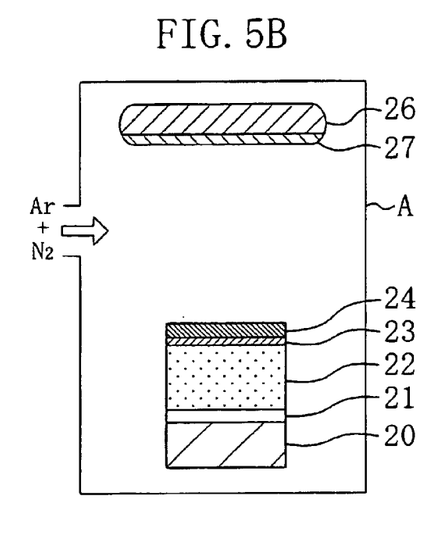

Subsequently, as shown in FIG. 5B, a mixed gas of an argon gas and a nitrogen gas with a partial pressure ratio of the nitrogen gas not less than a nitriding point, for example, with the partial pressure ratio of 50% or more is introduced into the first chamber A and discharge is caused. Thus, a titanium nitride film 27 including nitrogen in a ratio not less than a stoichiometric ratio is formed in a surface portion of the titanium nitride target 26, so that the titanium nitride film 27 can be sputtered by argon ions included in the plasma. Accordingly, a second barrier metal layer 24 of titanium nitride including nitrogen in a ratio not less than the stoichiometric ratio is formed on the first barrier metal layer 23. The second barrier metal layer 24 is formed in a thickness of approximately 10 nm.

Figure 5C:
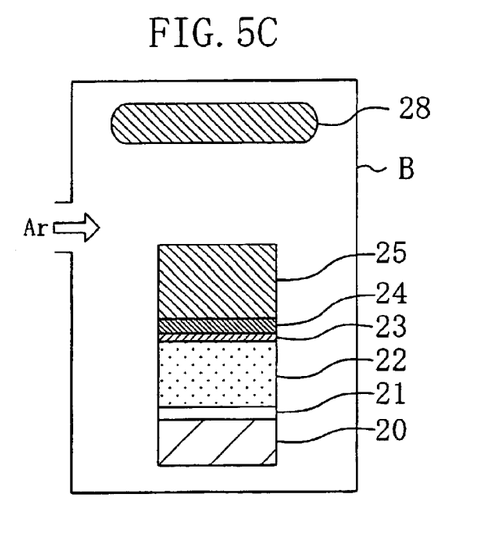

Next, as shown in FIG. 5C, the resultant silicon substrate 20 is placed in a second chamber B in which a tungsten target 28 principally including tungsten is disposed, an argon gas is introduced into the second chamber B and discharge is caused in the second chamber B. Thus, a tungsten film 25 with a thickness of approximately 50 nm is deposited on the second barrier metal layer 24.

In Embodiment 5, the first barrier metal layer 23 of the titanium nitride rich in titanium as compared with the stoichiometric ratio is formed by introducing the argon gas into the first chamber A in which the titanium nitride target 26 of the titanium nitride rich in titanium as compared with the stoichiometric ratio is disposed, and then the second barrier metal layer 24 of the titanium nitride including nitrogen in a ratio not less than the stoichiometric ratio is formed by introducing the mixed gas of the argon gas and the nitrogen gas with the partial pressure ratio of the nitrogen gas not less than the nitriding point. As a result, the polymetal gate electrode of Embodiment 2 can be definitely fabricated.

Embodiment 6

In Embodiment 6 of the invention, a second method for fabricating the polymetal gate electrode of Embodiment 2 will be described with reference to FIGS. 6A through 6C, 7A and 7B.

Figure 6A:
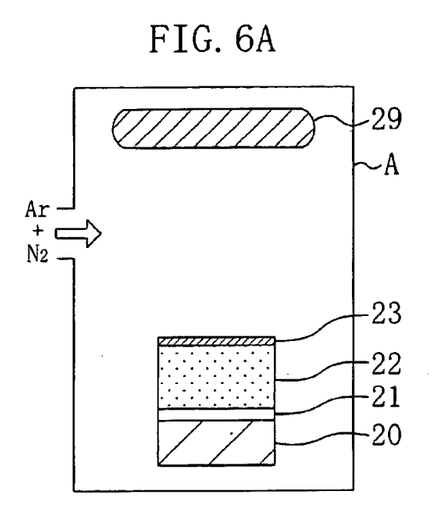
FIGS. 6A, 6B and 6C are cross-sectional views for showing procedures in a method for fabricating an electrode structure according to Embodiment 6 of the invention.

First, in the same manner as in Embodiment 3, a polysilicon film 22 with a thickness of approximately 80 nm is formed on a silicon substrate 20 with a gate insulating film 21 of a silicon oxide film sandwiched therebetween.

Next, as shown in FIG. 6A, the resultant silicon substrate 20 is placed in a first chamber A in which a titanium target 29 including substantially no nitrogen is disposed. Then, a first mixed gas of an argon gas and a nitrogen gas with a partial pressure ratio of the nitrogen gas lower than a nitriding point is introduced into the first chamber A and discharge is caused in the first chamber A. Thus, in the same manner as in Embodiment 4, a first barrier metal layer 23 of titanium nitride rich in titanium as compared with a stoichiometric ratio with a thickness of, for example, approximately 5 nm is formed on the polysilicon film 22. An example of the first mixed gas with the partial pressure ratio of the nitrogen gas lower than the nitriding point is a mixed gas with a partial pressure ratio of the nitrogen gas of approximately 15% with the DC power set to 1 kW.

Figure 6B:
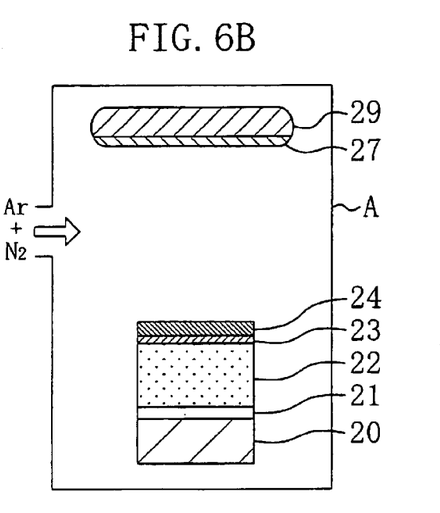

Subsequently, as shown in FIG. 6B, a second mixed gas of an argon gas and a nitrogen gas with a partial pressure ratio of the nitrogen gas not less than the nitriding point is introduced into the first chamber A and discharge is caused. An example of the second mixed gas with a partial pressure ratio of the nitrogen gas not less than the nitriding point is a mixed gas with a partial pressure ratio of the nitrogen gas of approximately 50% with the DC power set to 1 kw. Thus, a titanium nitride film 27 including nitrogen in a ratio not less than a stoichiometric ratio is formed in a surface portion of the titanium target 29, so that the titanium nitride film 27 can be sputtered by argon ions included in the plasma. As a result, a second barrier metal layer 24 of titanium nitride including nitrogen in a ratio not less than the stoichiometric ratio with a thickness of, for example, 10 nm is formed on the first barrier metal layer 23.

Figure 6C:
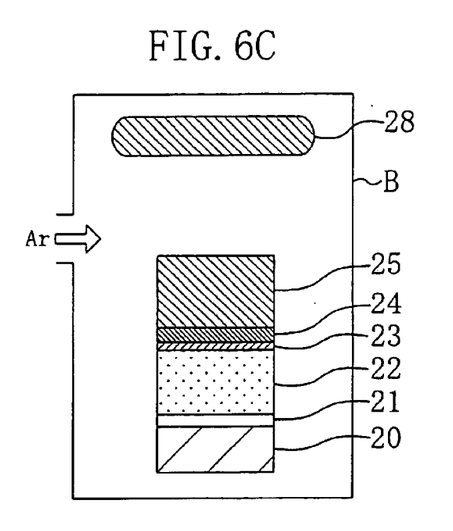
Figure 7A:
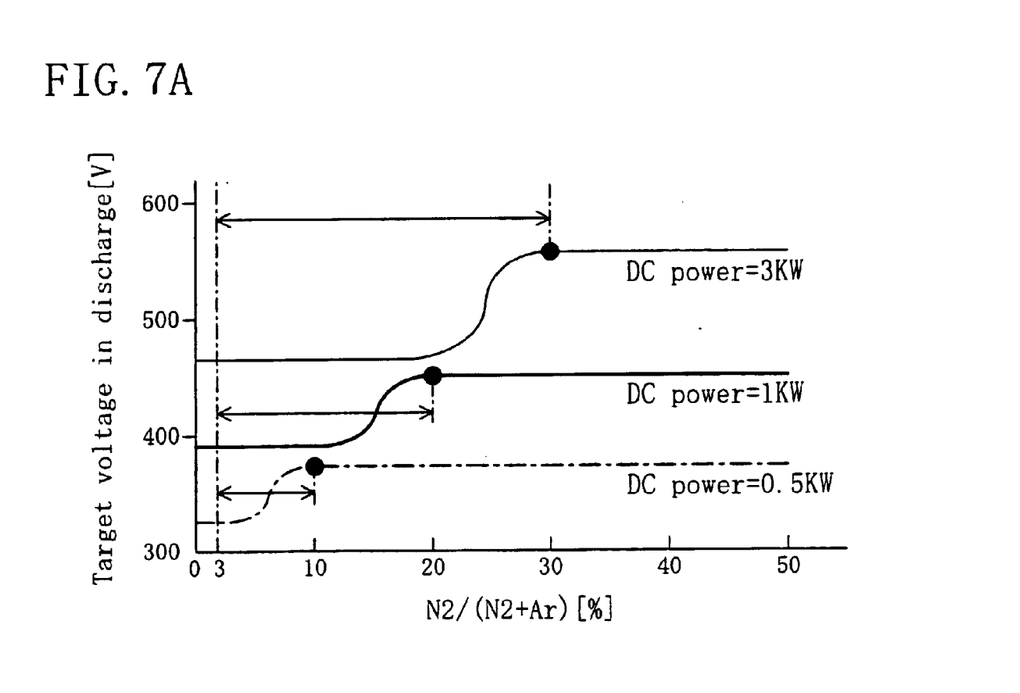
FIG. 7A is a diagram for showing the relationship between a partial pressure ratio of a nitrogen gas and a target voltage applied in discharge in forming a first barrier metal layer in the method for fabricating an electrode structure of Embodiment 6 and FIG. 7B is a diagram for showing the relationship between a partial pressure ratio of a nitrogen gas and a target voltage applied in discharge in forming a second barrier metal layer in the method for fabricating an electrode structure of Embodiment 6.
Figure 7B:
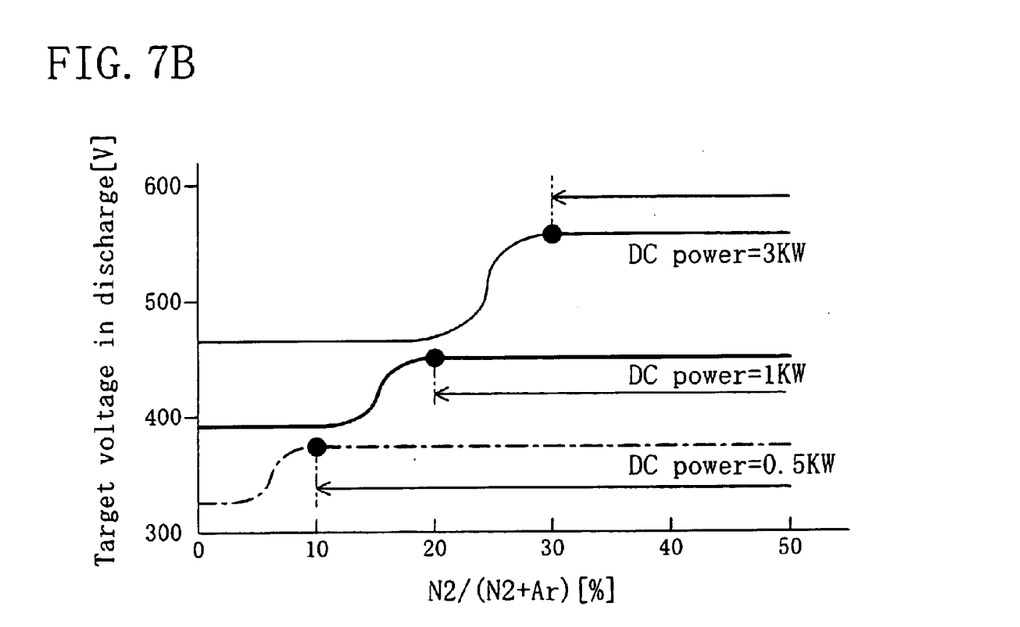

Then, as shown in FIG. 6C, the resultant silicon substrate 20 is placed in a second chamber B in which a tungsten target 28 principally including tungsten is disposed, an argon gas is introduced into the second chamber B and discharge is caused in the second chamber B. Thus, a tungsten film 25 with a thickness of approximately 50 nm is deposited on the second barrier metal layer 24.

In Embodiment 6, the first barrier metal layer 23 of the titanium nitride rich in titanium as compared with the stoichiometric ratio is formed by introducing the first mixed gas with the partial pressure ratio of the nitrogen gas lower than the nitriding point into the first chamber A in which the titanium target 29 is disposed, and then, the second barrier metal layer 24 of the titanium nitride including nitrogen in a ratio not less than the stoichiometric ratio is formed by introducing the second mixed gas with the partial pressure ratio of the nitrogen gas not less than the nitriding point. As a result, the polymetal gate electrode of Embodiment 2 can be definitely fabricated.

In this case, since the first mixed gas with the partial pressure ratio of the nitrogen gas lower than the nitriding point is introduced into the first chamber A in which the titanium target 29 is disposed, a reaction layer of a compound (SiN) principally including silicon and nitrogen is never formed or is formed in a very small thickness differently from the conventional technique (in which a mixed gas with a partial pressure ratio of the nitrogen gas not less than the nitriding point is introduced).

Embodiment 7

In any of Embodiments 3 through 6, the barrier metal layer 13 of the titanium nitride rich in titanium, or the first barrier metal layer 23 of the titanium nitride rich in titanium and the second barrier metal layer 24 of the titanium nitride including nitrogen in a ratio not less than the stoichiometric ratio are formed by the sputtering. Alternatively, the barrier metal layer may be deposited by CVD.

In employing the CVD, the barrier metal layer can be deposited by carrying out the CVD using a TiCl$_4$ gas at a temperature of approximately 680. The CVD using a TiCl$_4$ gas is represented by the following basic reaction formula:

$$6TiCl_4 + 8NH_3 \; 6\,TiN + 24\,HCl + N_2$$

The composition ratio x of nitrogen in titanium nitride (TiN$_x$) can be changed by controlling a flow ratio of the gas, the pressure of the gas or the deposition temperature. Organic CVD may be employed instead of the inorganic CVD using TiCl$_4$.

After forming the multi-layer film of the polysilicon film 12, the barrier metal layer 13 and the tungsten film 14 or the multi-layer film of the polysilicon film 22, the first barrier metal layer 23, the second barrier metal layer 24 and the tungsten film 25 as described in Embodiments 3 through 7, the multi-layer film is patterned into the polymetal gate electrode.

Subsequently, a lightly-doped layer is formed by implanting a dopant with the polymetal gate electrode used as a mask, a sidewall is formed on the side face of the polymetal gate electrode, and a heavily-doped layer is formed by implanting a dopant with the polymetal gate electrode and the sidewall used as a mask.

Thereafter, annealing is carried out at a temperature exceeding 750, for example, at 975 for 30 seconds, thereby activating the lightly-doped layer and the heavily-doped layer, and then, an interconnect layer is formed. Thus, a transistor including the polymetal gate electrode is completed.

What is claimed is:

1. A method for fabricating a gate electrode structure comprising the steps of:
   forming a silicon-containing film containing silicon as a principal constituent;
   forming, on said silicon-containing film, a barrier metal layer of titanium nitride rich in titanium as compared with a stoichiometric ratio;
   forming a metal film with a high melting point on said barrier metal layer, whereby forming a multi-layer film including said silicon-containing film, said barrier metal layer and said metal film with a high melting point; and
   patterning said multi-layer film into said gate electrode structure,
   wherein said gate electrode structure is formed on a gate insulating film,
   wherein said step of forming said barrier metal layer includes a sub-step of using a target of titanium nitride rich in titanium as compared with a stoichiometric ratio and causing discharge in an inert gas including substantially no nitrogen, thereby depositing, on said silicon-containing film, the titanium nitride rich in titanium as compared with the stoichiometric ratio sputtered out from said target.

2. A method for fabricating a gate electrode structure comprising the steps of:
   forming a silicon-containing film containing silicon as a principal constituent;
   forming, on said silicon-containing film, a barrier metal layer of titanium nitride rich in titanium as compared with a stoichiometric ratio;
   forming a metal film with a high melting point on said barrier metal layer, whereby forming a multi-layer film including said silicon-containing film, said barrier metal layer and said metal film with a high melting point; and
   patterning said multi-layer film into electrode structure,
   wherein said gate electrode structure is formed on a gate insulating film,
   wherein the step of forming said barrier metal layer includes a sub-step of using a target of titanium including substantially no nitrogen and causing discharge in a mixed gas of a nitrogen gas and an inert gas with a partial pressure ratio of the nitrogen gas lower than a nitriding point of said target, thereby depositing, on said silicon-containing film, titanium nitride rich in titanium as compared with a stoichiometric ratio formed through a reaction between titanium sputtered out from said target and nitrogen ions included in said mixed gas.

3. A method for fabricating a gate electrode structure comprising the steps of:
   forming a silicon-containing film containing silicon as a principal constituent;
   forming, on said silicon-containing film, a barrier metal layer of titanium nitride rich in titanium as compared with a stoichiometric ratio;
   forming a metal film with a high melting point on said barrier metal layer, whereby forming a multi-layer film including said silicon-containing film, said barrier metal layer and said metal film with a high melting point; and
   patterning said multi-layer film into an electrode structure,
   wherein said barrier metal layer is a diffusion preventing film for preventing impurities introduced into said silicon-containing film from diffusing to said metal film with a high melting point, and
   no titanium silicide layer is formed on said silicon-containing film through annealing carried out on said electrode structure at a temperature of 600° C. or more.

4. The method for fabricating a gate electrode structure of claim 3, wherein said step of patterning said multi-layer film includes a sub-step of patterning said silicon-containing film and said metal film with a high melting point into an equal pattern size.

5. The method for fabricating a gate electrode structure of claim 3, wherein said ratio of nitrogen (ratio of Ni/Ti) included in said barrier metal layer is approximately 0.7.

6. A method for fabricating a gate electrode structure comprising the steps of:
   forming a silicon-containing film containing silicon as a principal constituent;
   forming, on said silicon-containing film, a first barrier metal layer of titanium nitride rich in titanium as compared with a stoichiometric ratio;
   forming, on said first barrier metal layer, a second barrier metal layer of titanium nitride including nitrogen in a ratio not less than a stoichiometric ratio;
   forming a metal film with a high melting point on said second barrier metal layer, whereby forming a multi-layer film including said silicon-containing film, said first barrier metal layer, said second barrier metal layer and said metal film with a high melting point; and
   patterning said multi-layer film into said gate electrode structure,
   wherein said gate electrode structure is formed on a gate insulating film,
   wherein the step of forming said first barrier metal layer includes a sub-step of using a target of titanium nitride rich in titanium as compared with a stoichiometric ratio and causing discharge in an inert gas included in an inert gas including substantially no nitrogen, thereby depositing, on said silicon-containing film, the titanium nitride rich in titanium as compared with the stoichiometric ratio sputtered out from said target, and
   the step of forming said second barrier metal layer includes a sub-step of using said target and causing discharge in a mixed gas of a nitrogen gas and an inert gas with a partial pressure ratio of the nitrogen gas not less than a nitriding point of said target, thereby forming, on said target, a titanium nitride film rich in titanium as compared with the stoichiometric ratio and depositing, on said first barrier metal layer, the titanium nitride rich in titanium as compared with the stoichiometric ratio sputtered out from said titanium nitride film formed on said target.

7. A method for fabricating a gate electrode structure comprising the steps of:

forming silicon-containing film containing silicon as a principal constituent;

forming, on said silicon-containing film, a first barrier metal layer of titanium nitride rich in titanium as compared with a stoichiometric ratio;

forming, on said first hairier metal layer, a second barrier metal layer of titanium nitride including nitrogen in a ratio not less than a stoichiometric ratio;

forming a metal film with a high melting point on said second barrier metal layer, whereby forming a multi-layer film including said silicon-containing film, said first barrier metal layer, said second barrier metal layer and said metal film with a high melting point; and patterning said multi-layer film into said gate electrode structure, wherein said gate electrode structure is formed on a gate insulating film, wherein the step of forming said first barrier metal layer includes a sub-step of using a target including substantially no nitrogen and causing discharge in a mixed gas of a nitrogen gas and an inert gas with a partial pressure ratio of the nitrogen gas lower than a nitriding point of said target, thereby depositing, on said silicon-containing film, titanium nitride rich in titanium as compared with a stoichiometric ratio formed through a reaction between titanium sputtered out from said target and nitrogen ions included in said mixed gas, and the step of forming said second barrier metal layer includes a sub-step of using said target and causing discharge in a mixed gas of a nitrogen gas and an inert gas with a partial pressure ratio of the nitrogen gas not less than the nitriding point of said target, thereby forming, on said target, a titanium nitride film rich in titanium as compared with a stoichiometric ratio and depositing, on said first barrier metal layer, the titanium nitride rich in titanium as compared with the stoichiometric ratio sputtered out from said titanium nitride film formed on said target.

8. A method for fabricating a gate electrode structure comprising the steps of:

forming a silicon-containing film containing silicon as a principal constituent;

forming, on said silicon-containing film, a first barrier metal layer of titanium nitride rich in titanium as compared with a stoichiometric ratio;

forming, on said first barrier metal layer, a second barrier metal layer of titanium nitride including nitrogen in a ratio not less than a stoichiometric ratio;

forming a metal film with a high melting point on said second barrier metal layer, whereby forming a multi-layer film including said silicon-containing film, said first barrier metal layer, said second barrier metal layer and said metal film with a high melting point; and patterning said multi-layer film into an electrode structure, wherein said first barrier metal layer and said second barrier metal layer are diffusion preventing films for preventing impurities introduced into said silicon-containing film from diffusing to said metal film with a high melting point, and no titanium silicide layer is fanned on said silicon-containing film through annealing carried out on said electrode structure at a temperature of 600° C. or more.

9. The method for fabricating a gate electrode structure of claim 8, wherein said step of patterning said multi-layer film includes a sub-step of patterning said silicon-containing film and said metal film with a high melting point into an equal pattern size.

10. The method for fabricating a gate electrode structure of claim 8, wherein said ratio of nitrogen (ratio of N/Ti) included in said first barrier metal layer is approximately 0.7.

* * * * *